United States Patent
Wang et al.

(10) Patent No.: US 11,060,908 B1
(45) Date of Patent: Jul. 13, 2021

(54) DISPLAY MODULE AND METHOD FOR MONITORING BACKLIGHT BRIGHTNESS COMPRISING AN ARRAY SUBSTRATE WITH PLURAL GATE LINES, DATA LINES AND A PHOTOSENSITIVE UNIT

(71) Applicant: Shanghai Tianma Micro-Electronics Co., Ltd., Shanghai (CN)

(72) Inventors: Kan Wang, Shanghai (CN); Yang Nan, Shanghai (CN); Xiongping Li, Shanghai (CN); Xiaoping Sun, Shanghai (CN); Meilin Wang, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/845,577

(22) Filed: Apr. 10, 2020

(30) Foreign Application Priority Data

Dec. 30, 2019 (CN) .......................... 201911397209.5

(51) Int. Cl.
*G09G 3/34* (2006.01)
*G01J 1/46* (2006.01)
(Continued)

(52) U.S. Cl.
CPC .................. *G01J 1/46* (2013.01); *G09G 5/10* (2013.01); *H01L 27/124* (2013.01); *H01L 27/1443* (2013.01); *H01L 27/1446* (2013.01); *H01L 31/02005* (2013.01); *H01L 31/02019* (2013.01); *H01L 31/02164* (2013.01); *H01L 31/022466* (2013.01); *H01L 31/1136* (2013.01);
(Continued)

(58) Field of Classification Search
CPC ............ G09G 2360/16; G09G 3/3406; G09G 3/3413; G09G 2320/0626; G09G 2320/066; G02F 1/133602; G02F 1/13306; G02F 1/133611
USPC .............................................. 250/205, 214 R
See application file for complete search history.

(56) References Cited

U.S. PATENT DOCUMENTS 10,762,855 B2 *   9/2020   Chen .................... G02F 1/13452

FOREIGN PATENT DOCUMENTS

| CN | 101276107 A | 10/2008 |
|---|---|---|
| CN | 102005191 A | 4/2011 |

(Continued)

*Primary Examiner* — Que Tan Le
(74) *Attorney, Agent, or Firm* — Anova Law Group PLLC

(57) ABSTRACT

A display module and a method for monitoring backlight brightness are provided in the present disclosure. The display module includes a display region including an opening region and a non-opening region. The display module includes a backlight module and an array substrate. The array substrate is at a light-exiting side of the backlight module. The array substrate includes a plurality of gate lines which extends along a first direction and is arranged along a second direction, and further includes a plurality of data signal lines which is arranged along the first direction and extends along the second direction. The array substrate further includes a first substrate and at least one photosensitive unit, where the photosensitive unit is at a side of the first substrate away from the backlight module; and the photosensitive unit is disposed at the non-opening region for sensing a luminous brightness of the backlight module.

20 Claims, 5 Drawing Sheets

(51) Int. Cl.
*G09G 5/10* (2006.01)
*H01L 27/12* (2006.01)
*H01L 27/144* (2006.01)
*H01L 31/113* (2006.01)
*H01L 31/0224* (2006.01)
*H01L 31/02* (2006.01)
*H01L 31/0216* (2014.01)
*G01J 1/44* (2006.01)

(52) U.S. Cl.
CPC .................. *G01J 2001/4473* (2013.01); *G09G 2360/145* (2013.01)

(56) References Cited

FOREIGN PATENT DOCUMENTS

| | | |
|---|---|---|
| CN | 106200183 A | 12/2016 |
| CN | 209388679 U | 9/2019 |

* cited by examiner

| At the photo-sensing phase, the photosensitive unit receives light from the backlight module; the data signal line or the power voltage signal line input a signal to the photosensitive transistor; the photosensitive unit converts an optical signal to an electrical signal and transmits the electrical signal to the first capacitor connected in parallel with the photosensitive unit | ─ 301 |

| At the detection phase, a control signal is transmitted to the fourth gate electrode of the switch transistor to enable the switch transistor to be conducting, and the first capacitor transmits a stored electrical signal to the signal processing circuit through the switch transistor | ─ 302 |

| At the resetting phase, the control signal is transmitted to the fourth gate electrode of the switch transistor to enable the switch transistor to be cutoff and charges in the first capacitor to be cleared | ─ 303 |

FIG. 12

DISPLAY MODULE AND METHOD FOR MONITORING BACKLIGHT BRIGHTNESS COMPRISING AN ARRAY SUBSTRATE WITH PLURAL GATE LINES, DATA LINES AND A PHOTOSENSITIVE UNIT

CROSS-REFERENCE TO RELATED APPLICATION

This application claims the priority of Chinese Patent Application No. 201911397209.5, filed on Dec. 30, 2019, the content of which is incorporated herein by reference in its entirety.

TECHNICAL FIELD

The present disclosure generally relates to the field of display technology and, more particularly, relates to a display module and a method for monitoring backlight brightness.

BACKGROUND

Display screens are widely used in various products, such as mobile phones, TVs, vehicles, and the like. Particularly in the field of the vehicles, in-vehicle display screens may transfer important information to drivers, including vehicle driving conditions, safety warnings, abnormal reminders, and the like. If the display effect of in-vehicle display screens is abnormal (i.e., abnormal backlight brightness, unrecognizable picture content, and the like), it is very likely that drivers may not effectively recognize information in the in-vehicle display screens, thereby causing irreparable losses. Therefore, there is a need to provide a method for monitoring the backlight brightness of in-vehicle display screens, which may monitor abnormal backlight brightness in a timely manner.

SUMMARY

One aspect of the present disclosure provides a display module. The display module includes a display region including an opening region and a non-opening region. The display module includes a backlight module and an array substrate. The array substrate is at a light-exiting side of the backlight module. The array substrate includes a plurality of gate lines which extends along a first direction and is arranged along a second direction, and further includes a plurality of data signal lines which is arranged along the first direction and extends along the second direction. The plurality of gate lines and the plurality of data signal lines are all configured at the non-opening region, and the first direction intersects the second direction. The array substrate further includes a first substrate and at least one photosensitive unit. The photosensitive unit is at a side of the first substrate away from the backlight module, and the photosensitive unit is disposed at the non-opening region for sensing a luminous brightness of the backlight module.

Another aspect of the present disclosure provides a method for monitoring backlight brightness of a display module. The display module includes a backlight module and an array substrate. The array substrate is at a light-exiting side of the backlight module. The array substrate includes a plurality of gate lines which extends along a first direction and is arranged along a second direction, and further includes a plurality of data signal lines which is arranged along the first direction and extends along the second direction. The plurality of gate lines and the plurality of data signal lines are all configured at the non-opening region, and the first direction intersects the second direction. The array substrate further includes a first substrate and at least one photosensitive unit. The photosensitive unit is at a side of the first substrate away from the backlight module, and the photosensitive unit is disposed at the non-opening region for sensing a luminous brightness of the backlight module. The method for monitoring backlight brightness includes a photo-sensing phase and a detection phase. At the photo-sensing phase, the photosensitive unit receives light from the backlight module; the data signal line or the power voltage signal line input a signal to the photosensitive transistor; the photosensitive unit converts an optical signal to an electrical signal and transmits the electrical signal to a first capacitor connected in parallel with the photosensitive unit. At the detection phase, a control signal is transmitted to a fourth gate electrode of a switch transistor to enable the switch transistor to be conducting, and the first capacitor transmits a stored electrical signal to a signal processing circuit through the switch transistor.

Other aspects of the present disclosure can be understood by those skilled in the art in light of the description, the claims, and the drawings of the present disclosure.

BRIEF DESCRIPTION OF THE DRAWINGS

Drawings incorporated in the specification and forming a part of the specification demonstrate the embodiments of the present disclosure and, together with the specification, describe the principles of the present disclosure.

FIG. 12 illustrates a flow chart of a method for monitoring backlight brightness according to embodiments of the present disclosure.

DETAILED DESCRIPTION

Figure 1:
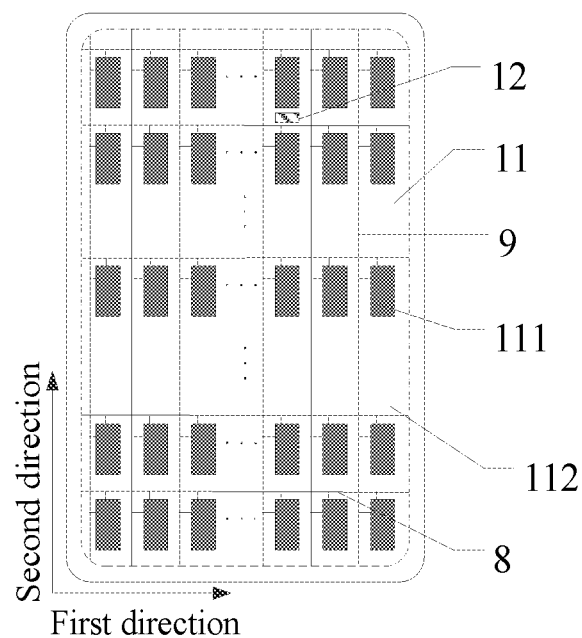
FIG. 1 illustrates a top view of a display module according to embodiments of the present disclosure.

Various embodiments of the present disclosure may be described in detail with reference to the drawings. It should be noted that, unless specifically stated otherwise, the relative arrangement of components and steps, numerical expressions, and numerical values set forth in the embodiments do not limit the scope of the present disclosure.

The following description of at least one embodiment may be merely illustrative and may be in no way intended to limit the present disclosure and its application or use.

Techniques, methods, and equipment known to those skilled in the art may not be discussed in detail, but where appropriate, the techniques, methods, and equipment should be considered as a part of the description.

In all examples shown and discussed herein, any specific value should merely be construed as exemplary and not as a limitation. Therefore, other examples of the embodiments may have different values.

It should be noted that similar reference numerals and letters indicate similar items in the following drawings. Therefore, once an item is defined in one drawing, it does not need to be discussed further in subsequent drawings.

In-vehicle display screens may transfer important information to drivers, including vehicle driving conditions, safety warnings, abnormal reminders, and the like. If the display effect of the in-vehicle display screens is abnormal (i.e., abnormal backlight brightness, unrecognizable picture content, and the like), it is very likely that drivers may not effectively recognize the information in the in-vehicle display screens, thereby causing irreparable losses. Therefore, there is a need to provide a method for monitoring the backlight brightness of the in-vehicle display screens, which may monitor abnormal backlight brightness in a timely manner.

Figure 2:
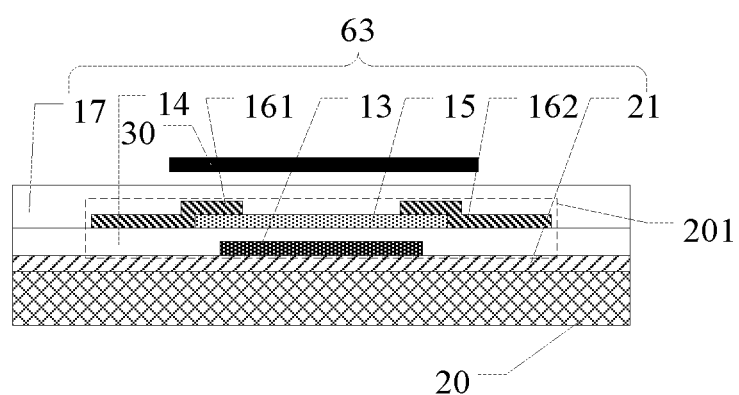
FIG. 2 illustrates a structural schematic of a film layer of a photosensitive transistor in a display module according to embodiments of the present disclosure.

FIG. 1 illustrates a top view of a display module according to embodiments of the present disclosure; and FIG. 2 illustrates a structural schematic of a film layer of a photosensitive transistor in a display module according to embodiments of the present disclosure. Referring to FIGS. 1-2, a display module 100 may be provided in the present disclosure. The display module 100 may include a display region 11, and the display region 11 may include an opening region 111 and a non-opening region 112. The display module 100 may include a backlight module 20 and an array substrate 63 which is at a light-exiting side of the backlight module 20. The array substrate 63 may include a plurality of gate lines 8 which may extend along a first direction and may be arranged along a second direction, and further include a plurality of data signal lines 9 which may be arranged along the first direction and may extend along the second direction. The gate lines 8 and the data signal lines 9 may all at the non-opening region 112, and the first direction may intersect the second direction. The array substrate 63 may further include a first substrate 21 and at least one photosensitive unit 12. The photosensitive unit 12 may be at a side of the first substrate 21 away from the backlight module 20. In addition, the photosensitive unit 12 may be disposed at the non-opening region 112 for sensing the luminous brightness of the backlight module 20.

For example, the display module 100 may be provided in the present disclosure. The display module 100 may include the backlight module 20 and the array substrate 63. The array substrate 63 may be at the light-exiting side of the backlight module 20. The plurality of gate lines 8 and the plurality of data signal lines 9 may be disposed at the array substrate 63. The plurality of gate lines 8 may extend along the first direction and be arranged along the second direction, and the plurality of data signal lines 9 may be arranged along the first direction and extend along the second direction. The display region 11 of the display module 100 may include the opening region 111 and the non-opening region 112, and the plurality of gate lines 8 and the plurality of data signal lines 9 may all at the non-opening region 112, which may avoid the influence on the light-exiting effect of the backlight module 20, thereby ensuring the display effect of the display module 100. It should be noted that the first direction may intersect the second direction. For example, the first direction may be perpendicular to the second direction.

The array substrate 63, disposed at the light-exiting side of the backlight module 20, may further include the first substrate 21 and at least one photosensitive unit 12. The photosensitive unit 12 may be disposed at the side of the first substrate 21 away from the backlight module 20, and a photosensitive surface of the photosensitive unit 12 may be disposed toward the light-exiting surface of the backlight module 20 to sense the luminous brightness of the backlight module 20, which may timely and sensitively detect the abnormal brightness of the backlight module 20, and timely provide warning feedback of the display module 100 to users, thereby avoiding the body damages and property losses of the users when a hazardous problem occurs in a device corresponding to the display module 100.

It should be noted that the arrangement density of the photosensitive units 12 in the array substrate 63 may not be limited in the present disclosure. For example, when only the backlight module 20 corresponding to a button position in the display module 100 is required to be monitored, it may be necessary to only dispose one photosensitive unit 12 in a corresponding position of the array substrate 63. That is, for an application environment with particularly high safety requirements such as an in-vehicle instrument, the photosensitive unit 12 may be arranged in a key region of the display region 11 which requires special attention to monitor the key region. For another example, when the backlight module 20 is divided and the divided backlight module 20 is locally adjusted, the luminous brightness of the backlight module 20 in each divided region may be monitored. That is, when the adjustment mode of the backlight module 20 is local dimming, the display module 100 may be divided according to the division of the backlight module 20. At this point, at least one photosensitive unit 12 may be respectively disposed at the middle position of each divided region to monitor the luminous brightness of the backlight module 20. For another example, the photosensitive units 12 may be arranged at an equal distance according to the area of the display region 11 of the display module 100, thereby implementing the monitoring of the entire backlight module 20. Furthermore, the photosensitive units 12 at different positions of the display module 100 may be adjusted based on different groups and may not necessarily set to work simultaneously. In such way, the diversified control of the photosensitive units 12 may be implemented to avoid wasting of resources.

Figure 3:
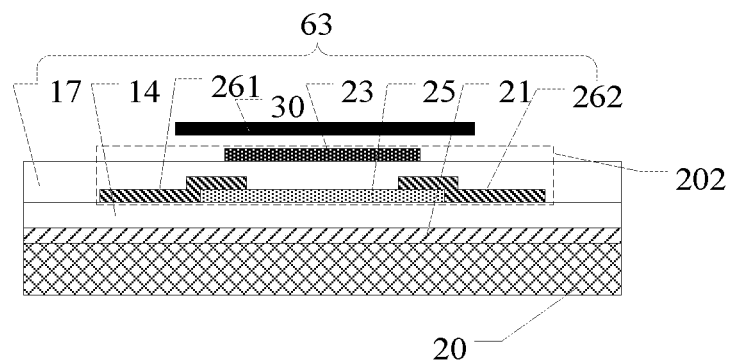
FIG. 3 illustrates another structural schematic of a film layer of a photosensitive transistor in a display module according to embodiments of the present disclosure.

FIG. 3 illustrates another structural schematic of a film layer of a photosensitive transistor in a display module according to embodiments of the present disclosure. Referring to FIGS. 1-3, optionally, the photosensitive unit 12 may include a photosensitive transistor 201/202. For example, any photosensitive unit 12 may include at least one photosensitive transistor 201/202. By combining the photosensitive transistor 201/202 with other devices, the luminous brightness of the backlight module 20 may be monitored, which may timely and sensitively detect the abnormal brightness of the backlight module 20, and timely provide warning feedback of the display module 100 to users.

Still in FIGS. 1-3, optionally, the photosensitive transistor 201/202 may include a channel region, and the array substrate 63 may further include a light-blocking layer 30. The light-blocking layer 30 may be disposed at a side of the photosensitive transistor 201/202 away from the first substrate 21. The orthographic projection of the light-blocking layer 30 on the plane of the first substrate 21 may cover the orthographic projection of the channel region on the plane of the first substrate 21.

For example, the array substrate 63 may further include the light-blocking layer 30. The light-blocking layer 30 may be disposed at the side of the photosensitive transistor 201/202 away from the first substrate 21. The orthographic projection of the light-blocking layer 30 on the plane of the first substrate 21 may cover the orthographic projection of the channel region on the plane of the first substrate 21. On the one hand, the light-blocking layer 30 may be used to prevent the light emitted from the backlight module 20 toward the photosensitive unit 12 from partially leaking out of the array substrate 63, thereby preventing the light, which are emitted from the backlight module 20 and detected by the photosensitive unit 12, from being relatively weak, which may make detection result inaccurate. On the other hand, the light-blocking layer 30 may also block external light from entering the array substrate 63, which may make the luminous brightness detected by the photosensitive unit 12 to be higher than a normal brightness result. Therefore, disposing the light-blocking layer 30 at the side of the photosensitive transistor 201/202 away from the first substrate 21 may be beneficial to ensure that the photosensitive unit 12 may detect accurate luminous brightness emitted by the backlight module 20.

It should be noted that the light-blocking layer 30 in the present disclosure may be a black matrix layer on a color film substrate disposed opposite to the array substrate 63 in the display module 100.

Referring to FIG. 2, optionally, the photosensitive transistor 201 may include a first gate electrode 13, a first insulation layer 14, a first semiconductor layer 15, a first source electrode 16/ and a first drain electrode 162, and a second insulation layer 17, which are sequentially disposed on the side of the first substrate 21 away from the backlight module 20 along the light-exiting direction of the backlight module 20.

For example, the present disclosure may provide two types of the photosensitive transistors with different film layer arrangements. The photosensitive transistor 201 of one film layer structure may be a bottom-gate structure, which may include the first gate electrode 13, the first semiconductor layer 15, the first source electrode 161 and the first drain electrode 162. The film layers of the photosensitive transistor 201 with the bottom-gate structure may be sequentially disposed at the side of the first substrate 21 away from the backlight module 20 along the light-exiting direction of the backlight module 20. The first insulation layer 14 may be disposed between the first gate electrode 13 and the first semiconductor layer 15, and the first source electrode 161 and the first drain electrode 162 may be disposed at a same layer. The first semiconductor layer 15 may be disposed at the side of the first source electrode 161 and the first drain electrode 162 adjacent to the first insulation layer 14. The channel region may be included between the first source electrode 161 and the first drain electrode 162. The second insulation layer 17 may be disposed at the side of the first source electrode 161 and the first drain electrode 162 away from the first insulation layer 14, and also may cover the above-mentioned channel region.

Still in FIG. 2, optionally, the first gate electrode 13 may be made of a transparent conductive material. For example, the first gate electrode 13 of the bottom-gate photosensitive transistor 201 may be made of the transparent conductive material to enhance the photosensitivity effect of the photosensitive transistor 201.

Referring to FIG. 3, optionally, the photosensitive transistor 202 may include the first insulation layer 14, a second semiconductor layer 25, a second source electrode 261 and a second drain electrode 262, the second insulation layer 17, and a second gate electrode 23, which are sequentially disposed at the side of the first substrate 21 away from the backlight module 20 along the light-exiting direction of the backlight module 20.

For example, the present disclosure may also provide the photosensitive transistor 202 of another film layer structure, where the photosensitive transistor 202 may be a top-gate structure. Different from the photosensitive transistor 201 with the bottom-gate structure, the second gate electrode 23 of the photosensitive transistor 202 with the top-gate structure may be disposed at the side of the second insulation layer 17 away from the second source electrode 261 and the second drain electrode 262. For example, the photosensitive transistor 202 with the top-gate structure may include the first insulation layer 14, the second semiconductor layer 25, the second source electrode 261 and the second drain electrode 262, the second insulation layer 17, and the second gate electrode 23, which are sequentially disposed at the side of the first substrate 21 away from the backlight module 20 along the light-exiting direction of the backlight module 20. The second insulation layer 17 may be filled in the channel region between the second source electrode 261 and the second drain electrode 262.

Referring to FIG. 1 and FIG. 3, optionally, the second gate electrode 23 may be made of a non-transparent material. For example, on the one hand, the second electrode 23 of the photosensitive transistor 202 with the top-gate structure may be made of the non-transparent material, which may, together with the above-mentioned light-blocking layer 30, prevent the light emitted from the backlight module 20 from leaking out of the array substrate 63, thereby preventing the light, which are emitted from the backlight module 20 and detected by the photosensitive unit 12, from being relatively weak which may make detection result inaccurate. On the other hand, the light-blocking layer 30, together with the light-blocking layer 30, may also block external light from entering the array substrate 63, which may make the luminous brightness detected by the photosensitive unit 12 to be higher than a normal brightness result. Therefore, the photosensitive transistor 202 is set as the top-gate structure and the second gate electrode 23 is set as not transparent, which may be beneficial to ensure that the photosensitive unit 12 may detect accurate luminous brightness emitted from the backlight module 20, and detected abnormal brightness of the backlight module 20 may be more accurate, and may be more beneficial to ensure that the abnormal warnings provided to users are accurate.

It should be noted that although the present disclosure provides two types of the photosensitive transistors 201 and 202, each photosensitive unit 12 may select one of such two types of the photosensitive transistors 201 and 202, which may not be limited according to the embodiments of the present disclosure.

Figure 4:
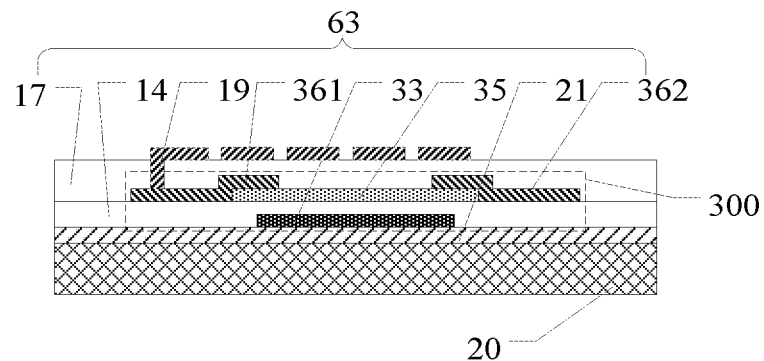
FIG. 4 illustrates a structural schematic of a film layer of a drive transistor in a display module according to embodiments of the present disclosure.

FIG. 4 illustrates a structural schematic of a film layer of a drive transistor in the display module according to embodiments of the present disclosure. Referring to FIGS. 2-4, optionally, the array substrate 63 may further include a drive transistor 300. The drive transistor 300 may include a third gate electrode 33, the first insulation layer 14, a third semiconductor layer 35, a third source electrode 362 and a third drain electrode 361, and the second insulation layer 17. The third gate electrode 33 and the first gate electrode 13 may be at a same layer and made of a same material. The third semiconductor layer 35 and the first semiconductor layer 15 or the second semiconductor layer 25 may be at a same layer and made of a same material. The third source electrode 362 and the third drain electrode 361, and the first source electrode 161 and the first drain electrode 162 or the second source electrode 261 and the second drain electrode 262 may be at a same layer and made of a same material.

The array substrate 63 may further include a pixel electrode 19. The pixel electrode 19 may be disposed at a same layer as the second gate electrode 23 and may be electrically connected to the third source electrode 362 through a via hole.

For example, the array substrate 63 may further include the drive transistor 300. The drive transistor 300 shown in the present disclosure may be a bottom-gate structure. The drive transistor 300 with the bottom-gate structure may include the third gate electrode 33, the first insulation layer 14, the third semiconductor layer 35, the third source electrode 362 and the third drain electrode 361, and the second insulation layer 17. Since the drive transistor 300 is the bottom-gate structure, if the photosensitive transistor is the photosensitive transistor 201 with the bottom-gate structure, the third gate electrode 33 and the first gate electrode 13 may be at a same layer and made of a same material; the third semiconductor layer 35 and the first semiconductor layer 15 may be at a same layer and made of a same material; and the third source electrode 362 and the third drain electrode 361 may be at a same layer and made of a same material as the first source electrode 161 and the first drain electrode 162. If the photosensitive transistor is the photosensitive transistor 202 with the top-gate structure, the third semiconductor layer 35 and the second semiconductor layer 25 may be at a same layer and made of a same material; the third source electrode 362 and the third drain electrode 361 may be at a same layer and made of a same material as the second source electrode 261 and the second drain electrode 262; and the third gate electrode 33 may be disposed at the side of the first insulation layer 14 away from the third semiconductor layer 35.

The array substrate 63 may further include the pixel electrode 19. The pixel electrode 19 may be disposed at the side of the second insulation layer 17 away from the third source electrode 362 and the third drain electrode 361. If the photosensitive transistor 202 is a top-gate structure, the pixel electrode 19 and the second gate electrode 23 may be disposed at a same layer or may be disposed at a same layer and made of a same material. Certain structures may have the photosensitive transistor 201/202 and the drive transistor 300 disposed at a same layer and made of a same material, which may be beneficial to simplify the fabrication process of the array substrate 63 and improve the fabrication efficiency of the array substrate 63.

It should be noted that, in the present disclosure, certain structures having the photosensitive transistor 201/202 and the drive transistor 300 disposed at a same layer and made of a same material may only provide a desirable manner, and different structures in a same film layer of the array substrate 63 may be made of different fabrication materials, which may not be limited in the present disclosure and may be adjusted according to requirements.

Figure 5:
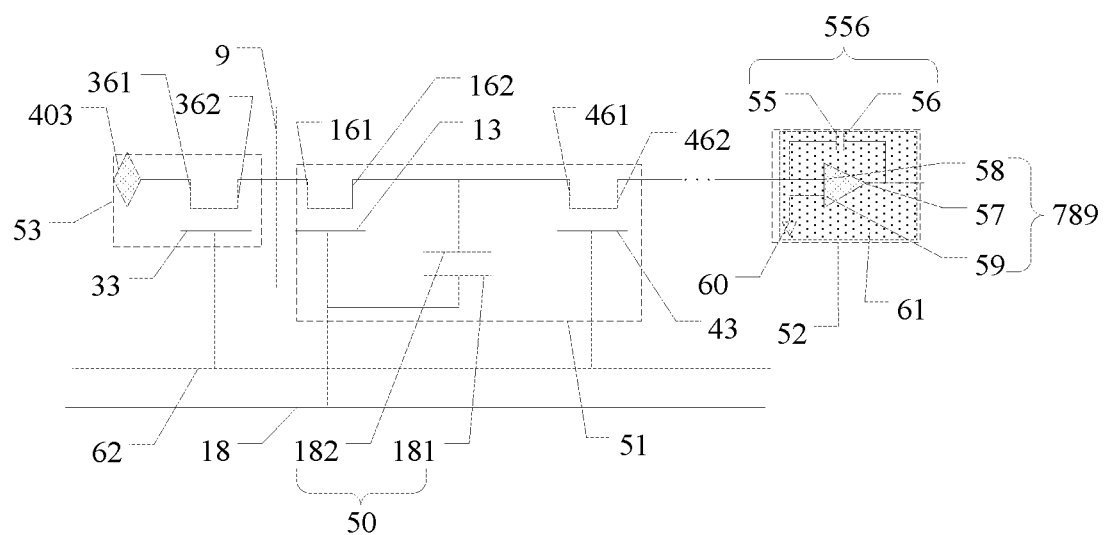
FIG. 5 illustrates a schematic of a circuit for monitoring backlight brightness according to embodiments of the present disclosure.

FIG. 5 illustrates a schematic of a circuit for monitoring the backlight brightness according to embodiments of the present disclosure. Referring to FIGS. 2-5, optionally, the array substrate 63 may further include a data signal line 9 which is disposed at a same layer as the third drain electrode 361. The third drain electrode 361 and the first drain electrode 162 or the second drain electrode 262 may all be connected to the data signal line 9.

For example, the array substrate 63 may further include the data signal line 9. In order to facilitate the fabrication of the array substrate 63, the data signal line 9 may be disposed at a same layer as the third drain electrode 361. The drive transistor 300 and the photosensitive transistor 201 with the bottom-gate structure may both be electrically connected to the data signal line 9. For example, the third drain electrode 361 of the drive transistor 300 and the first drain electrode 162 of the photosensitive transistor 201 may be electrically connected to the data signal line 9. Or, the drive transistor 300 and the photosensitive transistor 202 with the top-gate structure may both be electrically connected to the data signal line 9. For example, the third drain electrode 361 of the drive transistor 300 and the second drain electrode 262 of the photosensitive transistor 201 may be electrically connected to the data signal line 9. That is, a signal may be simultaneously transmitted to the drive transistor 300 and the photosensitive transistor 201/202 through one data signal line, which may further simplify the film layer structure of the array substrate 63 without affecting the signal transmission. It should be noted that the structural schematic of the film layer related to the data signal line 9 may refer to subsequent drawings of the present disclosure.

Figure 6:
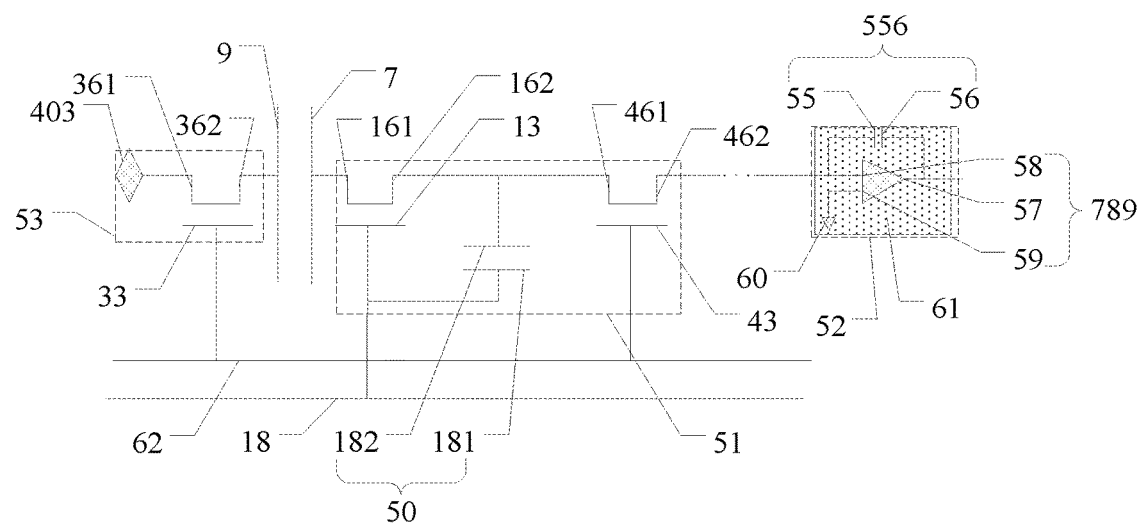
FIG. 6 illustrates another schematic of a circuit for monitoring backlight brightness according to embodiments of the present disclosure.

FIG. 6 illustrates another schematic of a circuit for monitoring the backlight brightness according to embodiments of the present disclosure. Referring to FIGS. 2-6, optionally, the array substrate 63 may further include the data signal line 9 and a power voltage signal line 7. The data signal line 9 and the power voltage signal line 7 may both be disposed at a same layer as the third drain electrode 361. The data signal line 9 may be electrically connected to the third drain electrode 361, and the first drain electrode 162 or the second drain electrode 262 may be electrically connected to the power voltage signal line 7.

For example, the array substrate 63 may further include both the data signal line 9 and the power voltage signal line 7. At this point, the data signal line 9 and the power voltage signal line 7 may both be disposed at a same layer as the third drain electrode 361 of the drive transistor 300, which may simplify the film layer structure of the array substrate 63 to a certain extent. Currently, an electrical signal may be transmitted to the drive transistor 300 through the data signal line 9 and the third drain electrode 361; an electrical signal may be transmitted to the photosensitive transistor 201 with the bottom-gate structure through the electrical connection between the power voltage signal line 7 and the first drain electrode 162; or an electrical signal may be transmitted to the photosensitive transistor 202 with the top-gate structure through the electrical connection between the power voltage signal line 7 and the second drain electrode 262. It should be noted that the structural schematic of the film layer related to the data signal line 9 and the power voltage signal line 7 may refer to subsequent drawings of the present disclosure.

Figure 7:
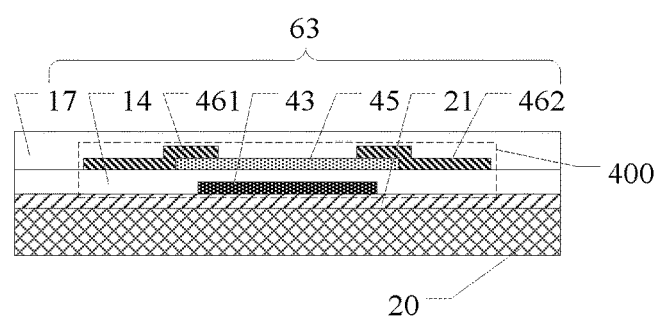
FIG. 7 illustrates a structural schematic of a film layer of a switch transistor in a display module according to embodiments of the present disclosure.

FIG. 7 illustrates a structural schematic of a film layer of a switch transistor in the display module according to embodiments of the present disclosure. Referring to FIGS.

2-4 and FIG. 7, optionally, the array substrate 63 may further include a switch transistor 400. The switch transistor 400 may include a fourth gate electrode 43, the first insulation layer 14, a fourth semiconductor layer 45, a fourth source electrode 462 and a fourth drain electrode 461, and the second insulation layer 17. The fourth gate electrode 43 and the third gate electrode 33 may be fabricated at a same layer and with a same material; the fourth semiconductor layer 45 and the third semiconductor layer 35 may be fabricated at a same layer and with a same material; and the fourth source electrode 462, the fourth drain electrode 461, and the third source electrode 362 may be fabricated at a same layer and with a same material.

For example, the array substrate 63 may further include the switch transistor 400. The switch transistor 400 shown in the present disclosure may be a bottom-gate structure and include the fourth gate electrode 43, the fourth semiconductor layer 45, the fourth source electrode 462 and the fourth drain electrode 461. The first insulation layer 14 may be disposed between the fourth gate electrode 43 and the fourth semiconductor layer 45; and the second insulation layer 17 may be disposed at the side of the fourth source electrode 462 and the fourth drain electrode 461 away from the fourth semiconductor layer 45. The fourth gate electrode 43 of the switch transistor 400 and the third gate electrode 33 of the drive transistor 300 may be fabricated at a same layer and with a same material; the fourth semiconductor layer 45 and the third semiconductor layer 35 of the drive transistor 300 may be fabricated at a same layer and with a same material; and the fourth source electrode 462 and the fourth drain electrode 461, and the third source electrode 362 may be fabricated at a same layer and with a same material. In such way, the fabrication process of the drive transistor 300, the photosensitive transistor 201/202 and the switch transistor 400 in the array substrate 63 may be simplified, and the fabrication efficiency of the array substrate 63 may be improved.

It should be noted that although the present disclosure only shows the switch transistor 400 with the bottom-gate structure, the switch transistor 400 may be set as the top-gate structure, or the drive transistor 300 and the photosensitive transistor 202 may also be set as the top-gate structure, which may be implemented by adjusting the corresponding process. That is, whether the drive transistor 300, the photosensitive transistor 201/202, and the switch transistor 400 in the array substrate 63 have the top-gate structure or the bottom-gate structure may not be limited in the present disclosure, as long as the transistors may be combined to monitor the luminous brightness of the light emitted from the backlight module 20, which may timely and sensitively detect the abnormal brightness of the backlight module 20, and timely provide warning feedback of the display module 100 to users, thereby avoiding the body damages and property losses of the users when a hazardous problem occurs in a device corresponding to the display module 100.

Figure 8:
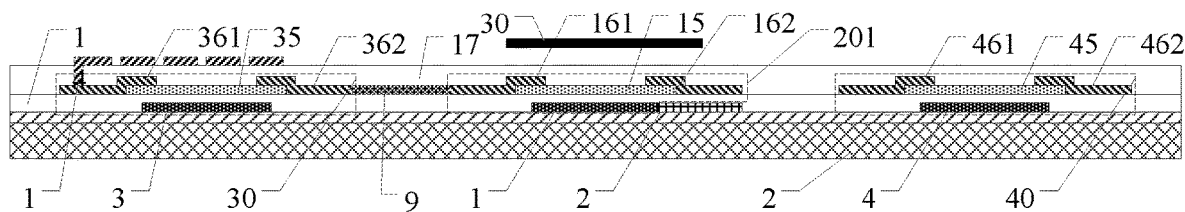
FIG. 8 illustrates a structural schematic of a film layer in a display module according to embodiments of the present disclosure.
Figure 9:
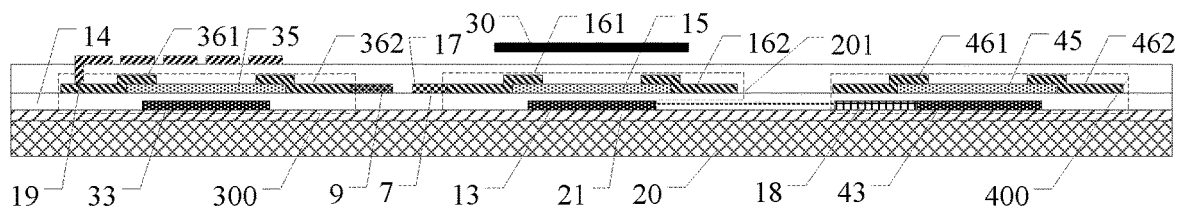
FIG. 9 illustrates another structural schematic of a film layer in a display module according to embodiments of the present disclosure.
Figure 10:
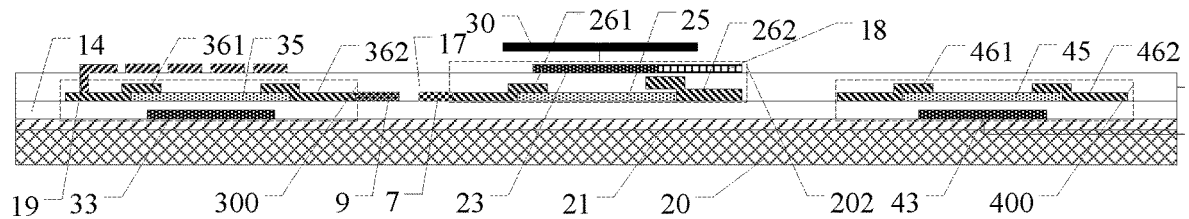
FIG. 10 illustrates another structural schematic of a film layer in a display module according to embodiments of the present disclosure.
Figure 11:
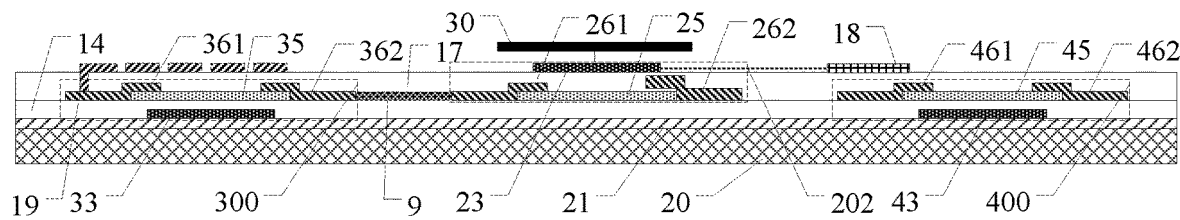
FIG. 11 illustrates another structural schematic of a film layer in a display module according to embodiments of the present disclosure.

FIG. 8 illustrates another structural schematic of a film layer in the display module according to embodiments of the present disclosure; FIG. 9 illustrates another structural schematic of a film layer in the display module according to embodiments of the present disclosure; FIG. 10 illustrates another structural schematic of a film layer in the display module according to embodiments of the present disclosure; and FIG. 11 illustrates another structural schematic of a film layer in the display module according to embodiments of the present disclosure. Referring to FIG. 5, FIG. 6, FIGS. 8-11, optionally, the array substrate 63 may further include a reference signal line 18. The reference signal line 18 and the first gate electrode 13 may be disposed at a same layer, and the reference signal line 18 may be electrically connected to the first gate electrode 13.

The orthographic projection of the reference signal line 18 on the plane of the first substrate 21 may at least partially overlap the orthographic projection of the first source electrode 161 or the second source electrode 261 on the plane of the first substrate 21; and a first capacitor 50 may be formed between the reference signal line 18 and the first source electrode 161 or the second source electrode 261. Or, the orthographic projection of the reference signal line 18 on the plane of the first substrate 21 may at least partially overlap the orthographic projection of the fourth source electrode 462 on the plane of the first substrate 21; and the first capacitor 50 may be formed between the reference signal line 18 and the fourth source electrode 462.

For example, the array substrate 63 may further include the reference signal line 18. When the photosensitive transistor 201 is the bottom-gate structure, the reference signal line 18 and the first gate electrode 13 may be disposed at a same layer, and the reference signal line 18 may be electrically connected to the first gate electrode 13; the orthographic projection of the reference signal line 18 on the plane of the first substrate 21 may need to at least partially overlap the orthographic projection of the first source electrode 161 on the plane of the first substrate 21, thereby forming the first capacitor 50 through the overlapped portion of the reference signal line 18 and the first source electrode 161, where the first capacitor 50 may be used to store charges transferred by the photosensitive transistor 201/202 when the power is turned on. When the photosensitive transistor 202 is the top-gate structure, the reference signal line 18 and the second gate electrode 23 may still be disposed at a same layer, and the reference signal line 18 may be electrically connected to the second gate electrode 23; the first capacitor 50 may be formed by the overlapped portion between the reference signal line 18 and the second source electrode 261, and may be used to store charges transferred by the photosensitive transistor 201/202 when the power is turned on.

Furthermore, the orthographic projection of the reference signal line 18 on the plane of the first substrate 21 may be disposed to at least partially overlap the orthographic projection of the fourth source electrode 462 on the plane of the first substrate 21, thereby forming the first capacitor 50 through the overlapped portion of the reference signal line 18 and the fourth source electrode 462 of the switch transistor 400, where the first capacitor 50 may be used to store charges transferred by the photosensitive transistor 201/202 when the power is turned on.

Three formation manners of the first capacitor 50 are provided in the above-mentioned embodiments, and the formation manner of the first capacitor 50 in the array substrate 63 may be determined according to actual requirements. In other cases, other formation manners may also be used, which may not be limited according to the embodiments of the present disclosure, and the above-mentioned embodiments may only be provided for reference.

FIG. 5 illustrates a schematic of a circuit for monitoring the backlight brightness according to embodiments of the present disclosure. Referring to FIG. 1 and FIG. 5, optionally, the display module 100 may include the circuit for monitoring the backlight brightness and at least one drive chip 61. The circuit for monitoring the backlight brightness may include a photosensitive circuit 51 and a signal processing circuit 52, which are electrically connected to each other. The photosensitive circuit 51 may include the photosensitive unit 12, and the signal processing circuit 52 may be disposed in the drive circuit 61.

For example, the display module 100 may further include the circuit for monitoring the backlight brightness and at least one drive chip 61. The circuit for monitoring the backlight brightness may include the photosensitive circuit 51 and the signal processing circuit 52, which are electrically connected to each other. The photosensitive circuit 51 may be used to sense the luminous brightness of the light emitted from the backlight module 20, and the signal processing circuit 52 may be used to receive the electrical signal of the photosensitive unit 12 outputted from the photosensitive circuit 51. The signal processing circuit 52 may be disposed in the drive chip 61 and may determine whether the luminous brightness of the backlight module 20 is normal by analyzing the change of the electrical signal. When the luminous brightness of the backlight module 20 is abnormal, the electrical signal may also fluctuate differently from a normal level. When the luminous brightness is abnormal, warning feedback of the display module 100 may be timely provided to users, thereby avoiding the body damages and property losses of the users when a hazardous problem occurs in a device corresponding to the display module 100. It should be noted that the photosensitive unit 12 may include the photosensitive transistor 201/202, so only the photosensitive transistor 201/202 may be shown in FIG. 5 for reference.

FIG. 6 illustrates another schematic of a circuit for monitoring the backlight brightness according to embodiments of the present disclosure. Referring to FIG. 6 and FIGS. 8-11, optionally, the photosensitive unit 12 may include the photosensitive transistor 201/202; the photosensitive circuit 51 may include the photosensitive transistor 201/202, the first capacitor 50, the switch transistor 400, and a first output terminal. A control terminal of the photosensitive transistor 201/202 may be connected to the reference signal line 18 and a first terminal 181 of the first capacitor 50; an input terminal of the photosensitive transistor may be connected to the data signal line 9 or the power voltage signal line 7, and an output terminal of the photosensitive transistor may be connected to a second terminal 182 of the first capacitor 50; the second terminal 182 of the first capacitor 50 may also be connected to the fourth source electrode 462 of the switch transistor 400; the fourth drain electrode 461 of the switch transistor 400 may be connected to the first output terminal, and the fourth gate electrode 43 of the switch transistor 400 may be connected to a control signal terminal 62; and the first output terminal may be connected to the signal processing circuit 52. It should be noted that the photosensitive unit 12 may include the photosensitive transistor 201/202, so only the photosensitive transistor 201/202 may be shown in FIG. 6 for reference.

For example, it should be noted that the above-mentioned control terminal of the photosensitive transistor 201/202 may be the first gate electrode 13 or the second gate electrode 23 of the photosensitive transistor 201/202; the input terminal of the photosensitive transistor 201/202 may be the first drain electrode 162 or the second drain electrode 262 of the photosensitive transistor 201/202; and the output terminal of the photosensitive transistor 201/202 may be the first source electrode 161 or the second source electrode 261 of the photosensitive transistor 201/202.

The photosensitive circuit 51 may include the photosensitive transistor 201/202, the first capacitor 50, the switch transistor 400, and the first output terminal. When the photosensitive transistor 201 is the bottom-gate structure and also when only the data signal line 9 is disposed in the circuit and the power voltage signal line 7 is not disposed in the circuit, the first source electrode 161 of the photosensitive transistor 201 and the third source electrode 362 of the drive transistor 300 may both be disposed at a same layer as the data signal line 9 and be electrically connected to the data signal line 9; the first gate electrode 13 of the photosensitive transistor 201 may be connected to the reference signal line 18 and the first terminal 181 of the first capacitor 50; the first drain electrode 162 of the photosensitive transistor 201 may be connected to the second terminal 182 of the first capacitor 50; the second terminal 182 of the first capacitor 50 may also be connected to the fourth source electrode 462 of the switch transistor 400; and the fourth drain electrode 461 of the switch transistor 400 may be connected to the first output terminal of the photosensitive circuit 51.

When the photosensitive transistor 201 is the bottom-gate structure, and the data signal line 9 and the power voltage signal line 7 are only disposed in the circuit, the first source electrode 161 of the photosensitive transistor 201 may be disposed at a same layer as the power voltage signal line 7 and be electrically connected to the power voltage signal line 7; the third source electrode 362 of the photosensitive transistor 201 may be disposed at a same layer as the data signal line 9 and be electrically connected to the data signal line 9; and other wiring manners may be the same as the above-mentioned embodiments.

When the photosensitive transistor 202 is the top-gate structure and also when only the data signal line 9 is disposed in the circuit and the power voltage signal line 7 is not disposed in the circuit, the second source electrode 261 of the photosensitive transistor 202 may be disposed at a same layer as the power voltage signal line 7 and be electrically connected to the power voltage signal line 7; the third source electrode 362 of the drive transistor 300 may be disposed at a same layer as the data signal line 9 and be electrically connected to the data signal line 9; the second gate electrode 23 of the photosensitive transistor 202 may be connected to the reference signal line 18 and the first terminal 181 of the first capacitor 50; the second drain electrode 262 of the photosensitive transistor 202 may be connected to the second terminal 182 of the first capacitor 50; the second terminal 182 of the first capacitor 50 may be connected to the fourth source electrode 462 of the switch transistor 400; and the fourth drain electrode 461 of the switch transistor 400 may be connected to the first output terminal of the photosensitive circuit 51.

When the photosensitive transistor 202 is the top-gate structure, and the data signal line 9 and the power voltage signal line 7 are only disposed in the circuit, the second source electrode 261 of the photosensitive transistor 202 and the third source electrode 362 of the drive transistor 300 may both be disposed at a same layer as the data signal line 9 and be electrically connected to the data signal line 9; and other wiring manners may be the same as the above-mentioned embodiments.

The first output terminal of the photosensitive circuit 51 may be electrically connected to the signal processing circuit 52. The signal processing circuit 52 may be used to receive an electrical signal of the photosensitive unit 12 outputted from the photosensitive circuit 51. The signal processing circuit 52 may determine whether the luminous brightness of the backlight module 20 is normal by analyzing the change of the electrical signal. When the luminous brightness of the backlight module 20 is abnormal, the electrical signal may also fluctuate differently from a normal level. When the luminous brightness is abnormal, warning feedback of the display module 100 may be timely provided to users.

Referring to FIG. 5 or FIG. 6, optionally, the signal processing circuit 52 may be an integration circuit. The signal processing circuit 52 disposed in the drive circuit 61 may be the integration circuit in the present disclosure. An electrical signal transmitted from the photosensitive circuit 51 may be received by the integration circuit, thereby more sensitively and accurately monitoring the abnormal situation of the luminous brightness of the backlight module 20.

Referring to FIG. 5 or FIG. 6, optionally, the signal processing circuit 52 may at least include a second capacitor 556, an amplifier 789, a second input terminal, a ground terminal 60, and a second output terminal. The second input terminal and the first output terminal may be connected to each other. The second input terminal may be connected to a first terminal 55 of the second capacitor 556 and a first terminal 58 of the amplifier 789. A second terminal 59 of the amplifier 789 may be connected to the ground terminal 60, and a third terminal 57 of the amplifier 789 may be connected to the second terminal 56 of the second capacitor 556 and the second output terminal.

For example, the signal processing circuit 52 (the integration circuit) may include the second input terminal. The second input terminal may be electrically connected to the first output terminal of the photosensitive circuit 51. The second input terminal may further be connected to the first terminal 55 of the second capacitor 556 and the first terminal 58 of the amplifier 789. The second terminal 59 of the amplifier 789 may be connected to the ground terminal 60, and the third terminal 57 of the amplifier 789 may be connected to the second terminal 56 of the second capacitor 556 and the second output terminal. The second output terminal may be connected to the drive chip 61. In such way, an electrical signal transmitted from the photosensitive circuit 51 may be received by the integration circuit through the drive chip 61, thereby more sensitively and accurately monitoring the abnormal situation of the luminous brightness of the backlight module 20.

Referring to FIG. 5 or FIG. 6, optionally, the display module may further include a pixel drive circuit 53. The pixel drive circuit 53 may include the drive transistor 300 and a light-emitting element 403. The third drain electrode 361 of the drive transistor 300 may be connected to the data signal line 9, the third source electrode 362 of the drive transistor 300 may be connected to the light-emitting element 403, and the third gate electrode 33 of the drive transistor 300 may be connected to the control signal terminal 62.

For example, the display module 100 may further include the pixel drive circuit 53. The pixel drive circuit 53 may include the drive transistor 300 and the light-emitting element 403 which may be a light-emitting device in the backlight module 20. The third drain electrode 361 of the drive transistor 300 may be connected to the data signal line 9 and receive an electrical signal through the data signal line 9. The third source electrode 362 of the drive transistor 300 may be connected to the light-emitting element 403, and the third gate electrode 33 may be connected to the control signal terminal 62 to receive a control signal.

FIG. 12 illustrates a flow chart of a method for monitoring backlight brightness according to embodiments of the present disclosure. Referring to FIG. 1, FIG. 5, FIG. 6 and FIG. 12, based on the same concept, the present disclosure further provides a method for monitoring the backlight brightness of the display module 100. The method for monitoring the backlight brightness may include a photo-sensing phase and a detection phase.

At step 301, which is the photo-sensing phase, the photosensitive unit 12 may receive light from the backlight module 20; the data signal line 9 or the power voltage signal line 7 may input a drive signal to the photosensitive transistor; the photosensitive unit 12 may convert an optical signal to an electrical signal and transmit the electrical signal to the first capacitor 50 connected in parallel with the photosensitive unit 12.

At step 302, which is the detection phase, a control signal may be transmitted to the fourth gate electrode 43 of the switch transistor 400 to enable the switch transistor 400 to be conducting, and the first capacitor 50 may transmit the stored electrical signal to the signal processing circuit 52 through the switch transistor 400.

For example, the present disclosure further provides the method, used for the display module 100, for monitoring the backlight brightness of the display module 100. The method for monitoring the backlight brightness may at least include the photo-sensing phase of step 301 and the detection phase of step 302. At the photo-sensing phase of step 301, the photosensitive unit 12 in the photosensitive circuit 51 may receive the light emitted from the backlight module 20; the data signal line 9 or the power voltage signal line 7 may input a signal to the photosensitive transistor 201/202; an optical signal emitted from the backlight module 20 may be converted to an electrical signal through the photosensitive unit 12 and the electrical signal received by the photosensitive transistor 201/202 may be transmitted to the first capacitor 50 connected in parallel with the photosensitive unit 12; and the first capacitor 50 may be used to store charges transmitted by the photosensitive transistor 201/202. It should be noted that the photosensitive unit 12 may include the photosensitive transistor 201/202, so only the photosensitive transistor 201/202 may be shown in FIG. 5 for reference.

The fourth gate electrode 43 may also be electrically connected to the control signal terminal 62. At the detection phase of step 302, a control signal may be transmitted to the fourth gate electrode 43 of the switch transistor 400 to enable the switch transistor 400 to be conducting. At this point, the charges stored in the first capacitor 50 may be transmitted to the signal processing circuit 52 through the switch transistor 400. In such way, the electrical signal transmitted from the photosensitive circuit 51 may be received by the integration circuit through the drive chip 61, thereby more sensitively and accurately monitoring the abnormal situation of the luminous brightness of the backlight module 20.

Referring to FIG. 5, FIG. 6 and FIG. 12, optionally, the method for monitoring the backlight brightness may further include a resetting phase of step 303. At the resetting phase of step 303, a control signal may be transmitted to the fourth gate electrode 43 of the switch transistor 400 to enable the switch transistor 400 to be cutoff, and the charges in the first capacitor 50 may be cleared.

For example, the method for monitoring the backlight brightness may further include the resetting phase of step 303. At the resetting phase of step 303, the control signal may be transmitted to the fourth gate electrode 43 of the switch transistor 400 to enable the switch transistor 400 to be cutoff. At this point, the charges originally stored in the first capacitor 50 may be cleared to wait for the execution of a next charge storage operation, that is, wait for a next detection.

Optionally, the display module 100 may further include a system host. At the detection phase of step 302, the signal processing circuit 52 may detect a voltage change value of the signal processing circuit. When the change value of the voltage is less than a preset value, the display module 100 may send a reminder of abnormal brightness to the system host.

For example, the display module 100 may further include the system host. At the detection phase of step 302, the signal processing circuit 52 may, by continuously detecting the voltage change, determine whether the luminous brightness of the backlight module 20 is normal according to the magnitude of the voltage value change. When a certain voltage value is less than a preset value, it may indicate that the luminous brightness, which is detected by the photosensitive transistor, of a position corresponding to the backlight module 20 may be insufficient at this point. Currently, there may be a problem in the corresponding system, and the display module 100 may send a reminder of abnormal brightness to the system host, which may avoid user losses caused by the product problem corresponding to the system. Obviously, a certain voltage value is less than a preset value may not be the only case; when a deviation between a detected voltage and a normal voltage is greater than a preset value, the luminous brightness of a position corresponding to the backlight module 20 may be too large. At this point, there may also be a problem in the corresponding system, and the display module 100 may send a reminder of abnormal brightness to the system host, which may avoid user losses caused by the product problem corresponding to the system.

From the above-mentioned embodiments, it can be seen that the display module and the method for monitoring the backlight brightness provided by the present disclosure may achieve at least the following beneficial effects.

In the present disclosure, at least one photosensitive unit may be disposed in the array substrate, and the luminous brightness of the backlight module may be directly monitored by disposing the photosensitive surface of the photosensitive unit toward the light-exiting surface of the backlight module, thereby directly monitoring the abnormal light-exiting case of the backlight module, which may be beneficial to improve the monitoring effect of the abnormal brightness of the backlight module and also ensure the safe use of the device corresponding to the backlight module.

Although the embodiments of the present disclosure have been described in detail through certain examples, those skilled in the art should understand that the above-mentioned examples may merely for illustration and may not be intended to limit the scope of the present disclosure. Those skilled in the art should understand that the above-mentioned embodiments may be modified without departing from the scope and spirit of the present disclosure, and the scope of the disclosure may be determined by the scope of the appended claims.

What is claimed is:

1. A display module, comprising:
    a display region, including an opening region and a non-opening region;
    a backlight module; and
    an array substrate, wherein:
        the array substrate is at a light-exiting side of the backlight module;
        the array substrate includes a plurality of gate lines which extends along a first direction and is arranged along a second direction, and further includes a plurality of data signal lines which is arranged along the first direction and extends along the second direction, wherein:
            the plurality of gate lines and the plurality of data signal lines are all configured at the non-opening region; and
            the first direction intersects the second direction; and
        the array substrate further includes a first substrate and at least one photosensitive unit, wherein:
            the photosensitive unit is at a side of the first substrate away from the backlight module; and
            the photosensitive unit is disposed at the non-opening region for sensing a luminous brightness of the backlight module.

2. The display module according to claim 1, wherein:
the photosensitive unit includes a photosensitive transistor.

3. The display module according to claim 2, wherein:
the photosensitive transistor includes a channel region, and the array substrate further includes a light-blocking layer, wherein:
    the light-blocking layer is at a side of the photosensitive transistor away from the first substrate; and
    an orthographic projection of the light-blocking layer on a plane of the first substrate covers an orthographic projection of the channel region on the plane of the first substrate.

4. The display module according to claim 2, wherein:
the photosensitive transistor includes a first gate electrode, a first insulation layer, a first semiconductor layer, a first source electrode and a first drain electrode, and a second insulation layer, which are sequentially disposed at the side of the first substrate away from the backlight module along a light-exiting direction of the backlight module.

5. The display module according to claim 4, wherein:
the first gate electrode is made of a transparent conductive material.

6. The display module according to claim 2, wherein:
the photosensitive transistor includes a first insulation layer, a second semiconductor layer, a second source electrode and a second drain electrode, a second insulation layer, and a second gate electrode, which are sequentially disposed at the side of the first substrate away from the backlight module along a light-exiting direction of the backlight module.

7. The display module according to claim 6, wherein:
the second gate electrode is made of a non-transparent material.

8. The display module according to claim 4, wherein:
the array substrate further includes a drive transistor, wherein:
    the drive transistor includes a third gate electrode, the first insulation layer, a third semiconductor layer, a third source electrode and a third drain electrode, and the second insulation layer;
    the third gate electrode and the first gate electrode are fabricated at a same layer and with a same material;
    the third semiconductor layer and the first semiconductor layer are fabricated at a same layer and with a same material;
    the third source/drain electrodes and the first source/drain electrodes are fabricated at a same layer and with a same material; and
the array substrate further includes a pixel electrode, wherein:

the pixel electrode and the second gate electrode are disposed at a same layer; and the pixel electrode is electrically connected to the third source electrode through a via hole.

9. The display module according to claim 8, wherein:
the array substrate further includes a data signal line of the plurality of data signal lines disposed at a same layer as the third drain electrode, wherein the third drain electrode and one of the first drain electrode and the second drain electrode are all connected to the data signal line.

10. The display module according to claim 8, wherein:
the array substrate further includes a data signal line of the plurality of data signal lines and a power voltage signal line, wherein:
the data signal line and the power voltage signal line are both disposed at a same layer as the third drain electrode;
the data signal line is electrically connected to the third drain electrode; and
the first drain electrode or the second drain electrode is electrically connected to the power voltage signal line.

11. The display module according to claim 8, wherein:
the array substrate further includes a switch transistor, wherein:
the switch transistor includes a fourth gate electrode, the first insulation layer, a fourth semiconductor layer, a fourth source electrode and a fourth drain electrode, and the second insulation layer;
the fourth gate electrode and the third gate electrode are fabricated at a same layer and with a same material;
the fourth semiconductor layer and the third semiconductor layer are fabricated at a same layer and with a same material; and
the fourth source/drain electrodes and the third source electrode are fabricated at a same layer and with a same material.

12. The display module according to claim 11, wherein:
the array substrate further includes a reference signal line, wherein the reference signal line and the first gate electrode are disposed at a same layer, and the reference signal line is electrically connected to the first gate electrode; and
an orthographic projection of the reference signal line on a plane of the first substrate at least partially overlaps an orthographic projection of the first source electrode or the second source electrode on the plane of the first substrate; and a first capacitor is formed between the reference signal line and the first source electrode or the second source electrode; or an orthographic projection of the reference signal line on the plane of the first substrate at least partially overlaps an orthographic projection of the fourth source electrode on the plane of the first substrate; and a first capacitor is formed between the reference signal line and the fourth source electrode.

13. The display module according to claim 1, further including:
a circuit for monitoring backlight brightness and at least one drive chip, wherein:
the circuit for monitoring backlight brightness includes a photosensitive circuit and a signal processing circuit, electrically connected to each other;
the photosensitive circuit includes the photosensitive unit; and
the signal processing circuit is disposed in the drive circuit.

14. The display module according to claim 13, wherein:
the photosensitive unit includes a photosensitive transistor;
the photosensitive circuit includes the photosensitive transistor, a first capacitor, a switch transistor, and a first output terminal;
a control terminal of the photosensitive transistor is connected to a reference signal line and a first terminal of the first capacitor;
an input terminal of the photosensitive transistor is connected to a data signal line or a power voltage signal line;
an output terminal of the photosensitive transistor is connected to a second terminal of the first capacitor;
the second terminal of the first capacitor is also connected to a fourth source electrode of the switch transistor;
a fourth drain electrode of the switch transistor is connected to the first output terminal;
a fourth gate electrode of the switch transistor is connected to a control signal terminal; and
the first output terminal is connected to the signal processing circuit.

15. The display module according to claim 13, wherein:
the signal processing circuit is an integration circuit.

16. The display module according to claim 13, wherein:
the signal processing circuit at least includes a second capacitor, an amplifier, a second input terminal, a ground terminal, and a second output terminal, wherein:
the second input terminal and a first output terminal are connected to each other;
the second input terminal is connected to a first terminal of the second capacitor and a first terminal of the amplifier;
a second terminal of the amplifier is connected to the ground terminal; and
a third terminal of the amplifier is connected to a second terminal of the second capacitor and the second output terminal.

17. The display module according to claim 14, further including:
a pixel drive circuit, wherein:
the pixel drive circuit includes a drive transistor and a light-emitting element;
a third drain electrode of the drive transistor is connected to the data signal line;
a third source electrode of the drive transistor is connected to the light-emitting element; and
a third gate electrode of the drive transistor is connected to the control signal terminal.

18. A method for monitoring backlight brightness of a display module, wherein:
the display module includes a backlight module and an array substrate, wherein:
the array substrate is at a light-exiting side of the backlight module;
the array substrate includes a plurality of gate lines which extends along a first direction and is arranged along a second direction, and further includes a plurality of data signal lines which is arranged along the first direction and extends along the second direction, wherein:
the plurality of gate lines and the plurality of data signal lines are all configured at a non-opening region; and the first direction intersects the second direction; and the array substrate further includes a first substrate and at least one photosensitive unit, wherein:

the photosensitive unit is at a side of the first substrate away from the backlight module; and the photosensitive unit is disposed at the non-opening region for sensing a luminous brightness of the backlight module; and the method for monitoring backlight brightness includes a photo-sensing phase and a detection phase, at the photo-sensing phase, the photosensitive unit receiving light from the backlight module; a data signal line or a power voltage signal line inputting a signal to a photosensitive transistor; the photosensitive unit converting an optical signal to an electrical signal and transmitting the electrical signal to a first capacitor connected in parallel with the photosensitive unit; and at the detection phase, a fourth gate electrode of a switch transistor receiving a control signal to enable a conduction of the switch transistor, and the first capacitor transmitting a stored electrical signal to a signal processing circuit through the switch transistor.

19. The method according to claim 18, further including:

at a resetting phase, the fourth gate electrode of the switch transistor receiving a control signal to enable a cutoff of the switch transistor and to zero charges in the first capacitor.

20. The method according to claim 18, wherein:

the display module further includes a system host; at the detection phase, the signal processing circuit detects a voltage change value of the signal processing circuit; and when the voltage change value is less than a preset value, the display module sends a reminder of abnormal brightness to the system host.

* * * * *